United States Patent [19]

Leenders et al.

[11] Patent Number: 5,498,504

[45] Date of Patent: Mar. 12, 1996

[54] PROCESS FOR THE PREPARATION OF AN IMAGE USING ONLY DRY STEPS

[75] Inventors: Luc Leenders; Eddie Daems, both of Herentals, Belgium

[73] Assignee: Agfa-Gevaert, N.V., Mortsel, Belgium

[21] Appl. No.: 346,161

[22] Filed: Nov. 21, 1994

[30] Foreign Application Priority Data

Dec. 20, 1993 [EP] European Pat. Off. .............. 93203596

[51] Int. Cl.⁶ .............................. G03C 8/04; G03C 8/06; G03C 11/12
[52] U.S. Cl. ................... 430/199; 430/203; 430/253; 430/254; 430/255; 430/256; 430/330; 430/353
[58] Field of Search ...................................... 430/253, 200, 430/203, 292, 330, 331, 199, 255, 355, 256, 258, 254, 353

[56] References Cited

U.S. PATENT DOCUMENTS 5,326,667  7/1994  Yokoya et al. ........................ 430/253
5,393,638  2/1995  Mouri et al. ........................... 430/253

FOREIGN PATENT DOCUMENTS 453235  1/1992  European Pat. Off. .
903849  8/1962  United Kingdom ................... 430/256

*Primary Examiner*—Lee C. Wright
*Attorney, Agent, or Firm*—Breiner & Breiner

[57] ABSTRACT

A process is provided for forming an image involving a photosensitive element comprising a photopolymerisable monomer and a reducible metal salt, preferably silver behenate, and a donor element containing a reducing agent. After lamination to a cover sheet, photopolymerisation and delamination, the image density is built up by lamination to the donor element, transfer of reducing agent and peeling-apart, possibly followed by heating the photosensitive element.

16 Claims, No Drawings

PROCESS FOR THE PREPARATION OF AN IMAGE USING ONLY DRY STEPS

FIELD OF THE INVENTION

The present invention relates to a process for forming an image which does not comprise wet treatment steps.

BACKGROUND OF THE INVENTION

In the pre-press sector of graphic arts conventional silver halide materials are used for a number of different applications. Rather sensitive camera materials are used for obtaining screened images. Scan films are used for producing colour separations from multicolour originals. Phototype setting materials record the information fed to phototype- and image setters. Relative insensitive photographic materials serve as duplicating materials usually in a contact exposure process. Silver halide materials have the advantage of high potential intrinsic sensitivity and excellent image quality. On the other hand they show the drawback of requiring several wet processing steps employing chemical ingredients which are suspect from an ecological point of view. E.g. the commonly used developing agent hydroquinone is a rather unwanted ingredient because of its allergenic effects. The biodegradation of disposed Phenidone is too slow. Sulphite ions show a high COD (Chemical Oxygen Demand) and the resulting sulphate ions are harmful for e.g. concrete. As a consequence it is undesirable that depleted solutions of this kind would be discharged into the public sewerage; they have to be collected and destroyed by combustion, a cumbersome and expensive process.

In the past several proposals have been made for obtaining an imaging element that can be developed using only dry development steps without the need of processing liquids as it is the case with silver halide photographic materials.

For instance, dry imaging elements are known that can be image-wise exposed using an image-wise distribution of heat. These types of dry imaging elements also called heat mode materials offer the advantage in addition to an ecological advantage that they do not need to be handled in a dark room nor any other protection from ambient light is needed. Heat mode recording materials are disclosed in e.g. U.S. Pat. Nos. 4,123,309, 4,123,578, 4,157,412, 4,547,456 and PCT applications WO 88/04237 and WO 93/03928. A disadvantage of heat mode recording materials is their low sensitivity requiring powerful exposure means. Moreover the density forming element, usually carbon, limits the obtainable sensitivity by its own absorption.

Another dry imaging system known for quite a while is 3M's dry silver technology. It is a catalytic process which couples the light-capturing capability of silver halide to the image-forming capability of organic silver salts. Traditionally, silver halide, preferably silver bromide, is formed in situ by reacting silver behenate with bromide ions. The result of this process is the formation of very fine grains of silver bromide, less than 500 angstroms in diameter and positioned in catalytic proximity to the silver behenate. Exposure to light causes photolytic reduction at the silver bromide crystal (latent image formation) and provides a silver nucleus in position to permit catalysis of the reduction of the organic silver salt to silver metal at an elevated temperature thus producing a visual density. A disadvantage of this technology is that in the non-exposed areas silver halide remains which forms print-out silver on aging thereby increasing the minimal density possibly to an unacceptable level for some purposes. Details on the dry silver technology can be found in U.S. Pat. Nos. 3,457,075, 3,839,049, 4,260,677 and J. Phot. Sci., Vol. 41 (1993), p. 108.

It is an object of the present invention to provide an alternative process for producing an image which requires no wet processing steps.

It is a further object of the present invention to provide a process for the formation of an image with low background density and excellent line and dot quality, and requiring no intense radiation source.

Other objects of the invention will become apparent from the description hereafter.

SUMMARY OF THE INVENTION

The objects of the present invention are realized by providing a process for forming an image comprising following steps:

(1) providing a photosensitive element comprising:
   (a) a support,
   (b) a contiguous layer 1, contiguous to said support,
   (c) a photosensitive layer or layer pack comprising, divided over one or more layers, a polymeric binder, an organic metal salt, a photoinitiator, optionally a photosensitizer and a polymerisable monomer, (2) laminating a cover sheet bearing a contiguous layer 2, contiguous to said cover sheet, onto said photosensitive element, so that said contiguous layer 2 faces said photosensitive layer or layer pack, said support or said cover sheet being transparent to actinic radiation, (3) exposing information-wise by actinic radiation said photosensitive element before or after performing said lamination step (2), thereby inducing photopolymerisation of said polymerisable monomer, (4) peeling apart said support and said cover sheet whereby either the exposed or the unexposed regions of said photosensitive layer adhere to said contiguous layer 1, and whereby the other regions adhere to contiguous layer 2, thus forming an imaged element A and an imaged element B, (5) providing a donor element comprising a support ($S_D$) and a donor layer containing a binder and a reducing agent, capable of becoming diffusable under the influence of heat, (6) bringing in contact said donor element with its donor layer side onto one of said elements A or B, thereby transferring reducing agent to said element A or B, and inducing reduction of the organic metal salt thus forming a metal image, and finally peeling apart said donor element from said metal image.

Preferably the reducible organic metal salt is an organic silver salt, most preferably silver behenate.

In an alternative embodiment of the present invention the position of the organic metal salt and the reducing agent are interchanged, in other words the organic metal salt is present in the donor element while the reducing agent is present in the photosensitive element. A similar result is obtained.

DETAILED DESCRIPTION OF THE INVENTION

The compositions of the photosensitive layer, the contiguous layers and the donor element will now be described in more detail.

Essential ingredients of the photosensitive layer or layer pack are a monomer, an organic metal salt, a photoinitiator and a binder. Other substances preferably present are a hydrogen donor, a toning agent and an optical sensitizer.

In one embodiment all these ingredients are present in one and the same layer. However in an alternative embodiment the photosensitive element can be splitted up in two or more layers, one of which contains the organic metal salt and another contains the photopolymerisable monomer and photoinitiator.

A wide variety of photopolymerisable and photocrosslinkable compounds can be used in the present invention, e.g. the monomers disclosed in DE-OS Nos. 4,005,231, 3,516,256, 3,516,257, 3,632,657 and U.S. Pat. No. 4,629,676, unsaturated esters of polyols, particularly such esters of the alpha-methylene carboxylic acids, e.g. ethylene diacrylate, glycerol tri(meth)acrylate, ethylene dimethacrylate, 1,3-propanediol di(meth)acrylate 1,2,4-butanetriol tri(meth)acrylate, 1,4-cyclohexanediol di(meth)acrylate, 1,4-benzenediol di(meth)acrylate, pentaerythritol tetra(meth)acrylate, pentaerythritol triacrylate, dipentaerythritol pentacrylate, trimethylolpropane triacrylate, 1,5-pentanediol di(meth)acrylate, the bis acrylates and methacrylates of polyethylene glycols of molecular weight 200–500, and the like: unsaturated amides, particularly those of the alphamethylene carboxylic acids, and especially those of Alpha-Omega-diamines and oxygen-interrupted omega-diamines, such as methylene bis-acrylamide, methylene bis-methacrylamide, 1,6-hexamethylene bis-acrylamide, diethylene triamine tris-methacrylamide, bis(gamma-methacrylamidopropoxy)ethane, beta-methacrylamidoethyl methacrylate, N-(beta-hydroxyethyl)-beta-(methacrylamido)ethyl acrylate and N,N-bis(beta-methacrylolyoxyethyl)acrylamide, vinyl esters e.g. divinyl succinate, divinyl adipate, divinyl phthalate, divinyl butane-1,4-disulfonate; and unsaturated aldehydes, e.g. sorbaldehyde (hexadienal). The photopolymerizable composition may also comprise polymers and/or oligomers comprising 2 or more polymerizable functions e.g. acrylated epoxies, polyester acrylates, urethane acrylates etc. It will be clear that these monomers and/or polymers and/or oligomers can be used in admixture.

It is also possible to use monofunctional (meth)acrylic acid esters as monomer provided they are not to volatile and do not spread an unwanted odour. Suitable compounds include n-octylacrylate, n-octylmethacrylate, decylacrylate, decylmethacrylate, stearylacrylate, stearylmethacrylate, cyclohexylacrylate, cyclohexylmethacrylate, phenylethylacrylate, phenylethylmethacrylate.

Further useful monomers include hydrophilic monomers showing a good dispersibility or solubility in water, e.g. sulphoethylmethacrylate, acrylamidomethylsulphonic acid, hydroxyethylmethacrylate and ethyleneoxide containing monomers like tetraethyleneglycolmono(meth)acrylate.

The most preferred polymerizable compounds comprise one or more (meth)acrylate functional groups.

Particular preferred classes of photopolymerizable compounds containing (a) (meth)acrylate group(s) are reactive multifunctional monomers disclosed in EP 0 502 562 and represented by general formula (I) or (II):

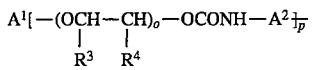

$$A[-NHCO-X-L^1(-(L^2)_u-OCO-CR^1=CH_2)_n]_m \quad (I)$$

wherein n represents an integer from 1 to 3, m equals an integer of 3 to 6 when n equals 1, and 2 to 6 when n equals 2 or 3, and u equals 0 or 1;

A represents an organic group of the following nature being 3 to 6 valent when n equals 1 and being 2 to 6 valent when n equals 2 or 3 a) a hydrocarbon residue containing 5 to 25 carbon atoms which may be interrupted by one or more ether, ester or amide functions;

$$A^1[-(OCH-CH)_o-OCONH-A^2]_p$$
$$\quad\quad\;\; | \quad\;\; |$$
$$\quad\quad R^3 \;\; R^4$$

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

$$A^1[-(OCH-CH)_o-OCO-A^2]_p$$
$$\quad\quad\;\; | \quad\;\; |$$
$$\quad\quad R^3 \;\; R^4$$

wherein $A^1$, $A^2$, $R^3$, $R^4$, o and p have the same meaning as defined above $$A^1[-(OCH-CH)_o-(G-Q)_r]_p$$
$$\quad\quad\;\; | \quad\;\; |$$
$$\quad\quad R^3 \;\; R^4$$

wherein $A^1$, $A^2$, $R^3$, $R^4$, o and p have the same meaning as defined above;

G represents $-O-CO-NH-Y(-COO-)_q-$;
wherein Y represents a divalent (cyclo)aliphatic residue containing 2 to 15 C-atoms and that may contain an ester, ether or urethane function, and q represents 0 or 1

Q represents a linear or branched aliphatic hydrocarbon residue containing 3 to 15 carbon atoms and which may comprise 1 to 3 oxygen bridges and r equals 0 or 1, X represents O or $NR^2$, $L^1$ represents an aliphatic hydrocarbon residue that is at least divalent and that may comprise 1 to 3 O-atoms, $L^2$ represents a lower alkylene of 1 to 6 C-atoms which may be branched or linear, $R^1$ represents hydrogen or a methyl group, $R^2$ represents hydrogen or a lower alkyl group of 1 to 6 C-atoms;

$$Ur[-R^7-NHCO-Z-R^8(-OCO-\underset{|}{\overset{R^9}{C}}=CH_2)_\alpha]_\beta \quad (II)$$

wherein

Ur represents a divalent or trivalent condensed urea residue;

Z represents O or $NR^{10}$ with $R^{10}$ representing alkyl containing 1 to 12 C-atoms;

$R^7$ represents a divalent hydrocarbon residue containing 2 to 25 C-atoms;

$R^8$ represents a hydrocarbon residue with a valence between 2 and 6, and containing 2 to 18 C-atoms, which can be linear or branched and which can be interrupted by upto 3 O atoms ;

$R^9$ represents hydrogen or methyl;

α represents an integer from 1 to 5, and

β equals 2 or 3.

Preferably used monomers comprise one of the following residues as hydrocarbon residue A and/or $A^2$ of general formula (I):

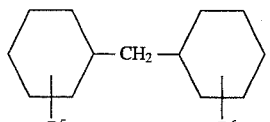
Ia $-(CH_2)_s-CH-(CH_2)_t-$
Ib

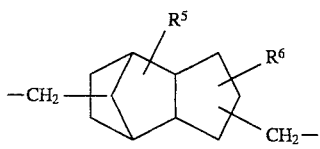
Ic

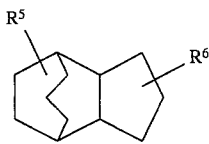
Id wherein $R^5$ and $R^6$ each independently represent hydrogen or a lower alkyl of 1 to 6 C-atoms, s and t independently represent an integer from 1 to 6 and wherein the aliphatic hydrocarbon residues Ia, Ic and Id comprise 2 to 6 free valences.

Examples of monomers according to formula (I) suitable for use in accordance with the present invention are shown in table 1.

TABLE 1

| | |
|---|---|
| $CH_3-CH_2-C[CH_2O-(CH_2CH-O)_{2.4}-CO-(CH_2)_5-NHCOO-CH_2-CH_2-O-CO-C=CH_2]_3$<br>$\hspace{4.5em}\vert\hspace{12em}\vert$<br>$\hspace{4.5em}CH_3\hspace{11em}CH_3$ | 1 |
| $CH_3-CH_2-C[CH_2O-(CH_2CH-O)_{2.4}-CO-(CH_2)_5-NHCOO-CH-(CH_2-O-CO-C=CH_2)_2]_3$<br>$\hspace{4.5em}\vert\hspace{15em}\vert$<br>$\hspace{4.5em}CH_3\hspace{14em}CH_3$ | 2 |
| $C[CH_2O-CO-(CH_2)_5-NH-COO-CH_2-CH_2-OCO-CH=CH_2]_4$ | 3 |
| $C[CH_2O-CO-(CH_2)_5-NH-COO-CH_2-CH_2-OCO-C=CH_2]_4$<br>$\hspace{14em}\vert$<br>$\hspace{14em}CH_3$ | 4 |
| $[(CH_2=C-COO-CH_2)_2-CH-OOCNH-(CH_2)_5-COO-CH_2]_2$<br>$\hspace{1em}\vert$<br>$\hspace{1em}CH_3$ $\hspace{18em}$ C<br>$[CH_2=C-COO-CH_2-CH_2-OOCNH-(CH_2)_5-COO-CH_2]_2$<br>$\hspace{1em}\vert$<br>$\hspace{1em}CH_3$ | 5 |
| $[(CH_2=C-COO-CH_2)_2-CH-OOCNH-(CH_2)_5-COO-CH_2]_i$<br>$\hspace{1em}\vert$<br>$\hspace{1em}CH_3$ $\hspace{18em}$ C<br>$[CH_2=C-COO-CH_2-CH_2-OOCNH-(CH_2)_5-COO-CH_2]_j$<br>$\hspace{1em}\vert$<br>$\hspace{1em}CH_3$ | 6 |
| i and j are respectively 3.5 and 0.5 indicating that compound 6 is a mixture of compounds obtained by reacting i equivalents of glycerine-dimethacrylate and j equivalents of hydroxyethyl methacrylate as disclosed in DE 3,703,130. | |
| $[(CH_2=C-COO-CH_2)_2-CH-OOCNH-(CH_2)_5-COO-CH_2]_i$<br>$\hspace{1em}\vert$<br>$\hspace{1em}CH_3$ $\hspace{18em}$ C<br>$[CH_2=C-COO-CH_2-CH_2-OOCNH-(CH_2)_5-COO-CH_2]_j$<br>$\hspace{1em}\vert$<br>$\hspace{1em}CH_3$ | 7 |
| i and j are respectively 2.5 and 1.5 indicating that compound 7 is a mixture of compounds obtained by reacting i equivalents of glycerine-dimethacrylate and j equivalents of hydroxyethyl methacrylate as disclosed in DE 3,703,130. | |
| $\hspace{14em}CH_3$<br>$\hspace{14em}\vert$<br>$C[CH_2O-CO(CH_2)_5-NH-COO-CH-(CH_2-O-CO-C=CH_2)_2]_4$ | 8 |

TABLE 1-continued

| | |
|---|---|
| $(CH_2=\underset{\underset{CH_3}{\mid}}{C}-COO-CH_2)_2-CH-OOCNH-(CH_2)_5-CO-(O-\underset{\underset{CH_3}{\mid}}{CH}CH_2)_{2.4}-O-CH_2\diagdown\atop\diagup C-C_2H_5$ | 9 |
| $[CH_2=\underset{\underset{CH_3}{\mid}}{C}-COO-CH_2-CH_2-OOCNH-(CH_2)_5-CO-(O-\underset{\underset{CH_3}{\mid}}{CH}CH_2)_{2.4}-O-CH_2]_2$ | |
| $CH_3-CH_2-C[CH_2O-(\underset{\underset{CH_3}{\mid}}{CH_2CH}-O)_{2.4}-CO-(CH_2)_5-NHCOO-CH_2-CH_2-O-CO-CH=CH_2]_3$ | 10 |
| $C[CH_2O-CO-NH-CH_2-\underset{\underset{CH_3}{\mid}}{\overset{\overset{CH_3}{\mid}}{C}}-CH_2-CH-CH_2-CH_2-NH-COO-CH-(CH_2-O-CO-\underset{\underset{CH_3}{\mid}}{C}=CH_2)_2]_4$ | 11 |
| $C[CH_2O-CO-NH-(CH_2)_6-NH-COO-CH-(CH_2-O-CO-\underset{\underset{CH_3}{\mid}}{C}=CH_2)_2]_4$ | 12 |
| $C_2H_5-C[CH_2O-CO-NH-(CH_2)_6-NH-COO-CH-(CH_2-O-CO-\underset{\underset{CH_3}{\mid}}{C}=CH_2)_2]_3$ | 13 |

Structure 14: Bisphenol-type structure with $(CH_2=\underset{CH_3}{C}-COO-CH_2)_2-CH-OOCNH-$ attached to one phenyl ring, and on the other ring bearing $CH_3$, two substituents: $NHCOO-CH-(CH_2-O-CO-\underset{CH_3}{C}=CH_2)_2$ and $NHCOO-CH_2-CH_2-OCO-\underset{CH_3}{C}=CH_2$.

Structure 15: Similar bisphenyl-$CH_2$-linked framework with $(CH_2=\underset{CH_3}{C}-COO-CH_2)_2-CH-OOCNH-$ on one ring; other ring has $CH_3$, $NHCOO-CH-(CH_2-O-CO-\underset{CH_3}{C}=CH_2)_2$, and $NHCOO-(CH_2)_4-OCO-CH=CH_2$.

Structure 16: Bisphenyl-$CH_2$ bridge; one ring carries $(CH_2=\underset{CH_3}{C}-COO-CH_2)_2-CH-OOCNH-$; the other ring bears two $NHCOO-CH-(CH_2-O-CO-\underset{CH_3}{C}=CH_2)_2$ groups.

Structure 17: Bisphenyl-$CH_2$ bridge; $CH_2=CH-COO-(CH_2)_3-OOCNH-$ on one ring; the other ring has two $NHCOO-(CH_2)_3-OCO-CH=CH_2$ substituents.

Structure 18: Bisphenyl-$CH_2$ bridge; one ring bears $(CH_2=\underset{CH_3}{C}-COO-CH_2)_2-CH-OOCNH-$; the other ring bears $NHCOO-CH-(CH_2-O-CO-\underset{CH_3}{C}=CH_2)_2$ and $NHCOO-CH_2-CH_2-OCO-\underset{CH_3}{C}=CH_2$.

Structure 19: $C_2H_5-C[\,CH_2O-CO-NH-CH_2-\text{(dicyclopentadienyl framework)}-CH_2-NH-COO-CH-(CH_2-O-CO-\underset{CH_3}{C}=CH_2)_2\,]_3$ TABLE 1-continued

[Structure 20]: $C_2H_5-C[CH_2O-CO-NH-CH_2-\text{(tricyclodecane)}-CH_2-NH-COO-CH_2-CH_2-OCO-C(CH_3)=CH_2]_3$

[Structure 21]: $C_2H_5-C[CH_2O-CO-NH-CH_2-\text{(tricyclodecane)}-CH_2-NH-COO-CH_2-C(CH_2OOC-CH=CH_2)_3]_3$

[Structure 22]: $C[CH_2O-CO-NH-CH_2-\text{(tricyclodecane)}-CH_2-NH-COO-CH-(CH_2-O-CO-C(CH_3)=CH_2)_2]_4$

[Structure 23]:
$(CH_2=C(CH_3)-COO-CH_2)_2-CH-OOCNH-(CH_2)_5-COO-CH_2-\text{(tricyclodecane)}$
$(CH_2=C(CH_3)-COO-CH_2)_2-CH-OOCNH-(CH_2)_5-COO-CH_2$

[Structure 24]: $C_2H_5-C[CH_2OOC-NH-\text{(trimethylcyclohexane)}-CH_2-NHCOO-(CH_2)_3OOC-C(CH_3)=CH_2]_3$

[Structure 25]:
$[(CH_2=C(CH_3)-COO-CH_2)_2-CH-OOCNH-(CH_2)_5-COO-CH_2]_3$
$CH_2=C(CH_3)-COO-CH_2-CH_2-OOCNH-(CH_2)_5-COO-CH_2$ — C The fractal indexes in the formulas 1, 2 and 10 indicate that these formulas represent a mixture of compounds having a different length of the ethylene-oxide piece in said formulas the indexes thus representing an avarage of said ethylene-oxide piece. The formulas 14 to 23 represent a mixture of structural isomers and can be used in accordance with the present invention without separation of the isomers.

The monomers corresponding to general formula (I) are known and can be prepared according to the German patent application numbers 3,522,005, 3,703,080, 3,643,216, 3,703,130, 3,917,320 and 3,743,728.

In general monomer formula (II) preferred condensed urea residues represented by Ur are following structural units:

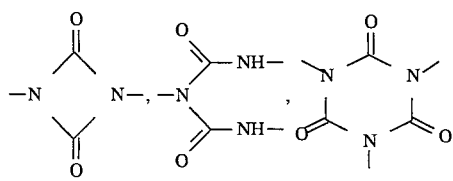

Examples of preferred useful monomers according to general formula (II) are listed below in table 2:

TABLE 2

II-1: $CH_2=CH-COO-CH_2-CH_2-O-C(=O)-NH-(CH_2)_6-N\text{(ring)}N-(CH_2)_6-HN-C(=O)-O-CH_2-CH_2-OOC-CH=CH_2$ TABLE 2-continued
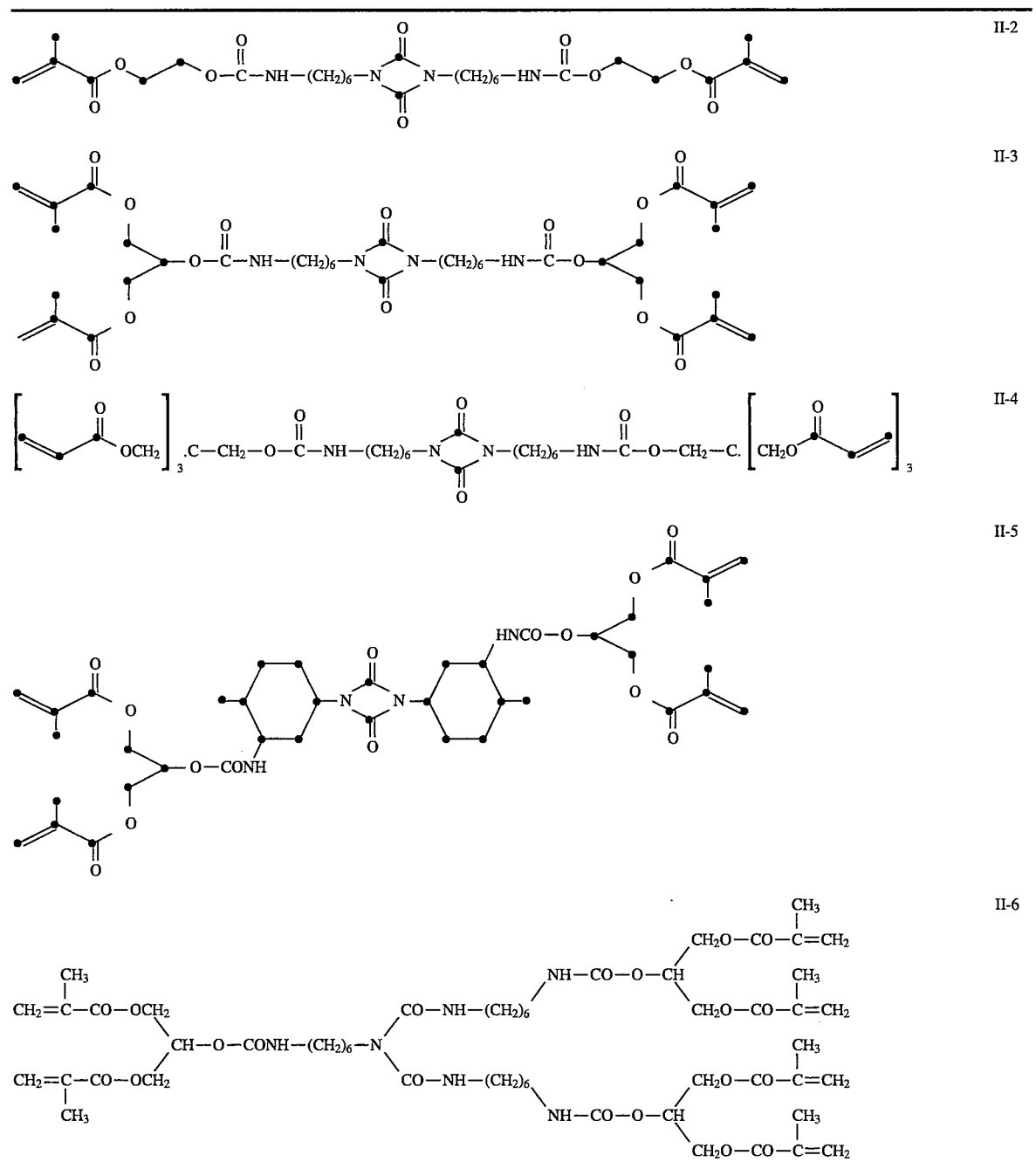

TABLE 2-continued

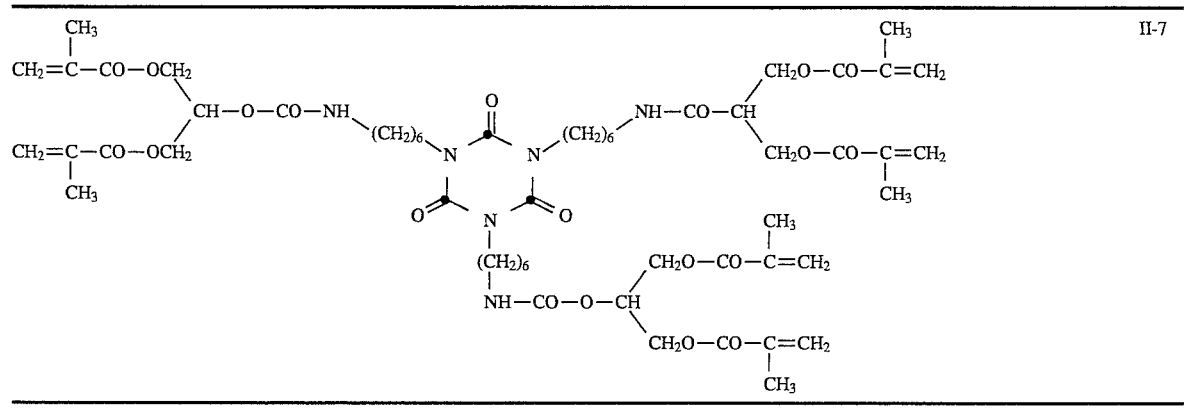

The monomer is preferably present in the photosensitive layer in an amount between $10^{-4}$ mol/m$^2$ and $10^{-1}$ mole/m$^2$.

In a preferred embodiment the organic metal salt is a silver salt. Substantially light-insensitive organic silver salts particularly suited for use according to the present invention in the photosensitive recording layer are silver salts of aliphatic carboxylic acids known as fatty acids, wherein the aliphatic carbon chain has preferably at least 12 C-atoms, e.g. silver laurate, silver palmitate, silver stearate, silver hydroxystearate, silver oleate and silver behenate. Silver salts of modified aliphatic carboxylic acids with thioether group as described e.g. in GB-P 1,111,492 and other organic silver salts as described in GB-P 1,439,478, e.g. silver benzoate and silver phthalazinone, may be used likewise to produce a thermally developable silver image. Further can be used silver salts of aromatic carboxylic acids (e.g. benzoic acid, phtalic acid, terephtalic acid, salicylic acid, m-nitrobenzoic-, phenylacetic-, pyromellitic-, p-phenylbenzoic-, camphoric-, huroic-, acetamidobenzoic- and o-aminobenzoic acid, etc.). Furtheron can be used silver salts of mercapto group- or thione group-containing compounds (e.g., 3-mercapto-4-phenyl-1,2,4-triazole, 2-mercaptobenzimidazole, etc.) or an imino group-containing compound (e.g. benzotriazole or derivatives thereof as described in GB 1,173,426 and U.S. Pat. No. 3,635,719, etc.). Further are mentioned silver imidazolates and the substantially light-insensitive inorganic or organic silver salt complexes described in U.S. Pat. No. 4,260,677.

In a most preferred embodiment of the present invention the organic silver salt is silver behenate. The compound is colorless, visibly stable toward light, insoluble in many volatile liquid vehicles, and moisture-resistant. It is produced in the desired physical form without difficulty and at reasonable cost.

Other reducible organic metal salts beside silver salts include e.g. iron(III) stearate, iron(III) rosinate, iron(III) laurate, nickel stearate, nickel rosinate, nickel acetate, nickel oleate, copper rosinate, copper acetate, cobalt stearate, cobalt acetate and zinc stearate. A particular salt is often used in combination with a particular reducing agent in the donor element (see furtheron) in order to obtain optimal results.

The organic metal salt is preferably present in an amount between 1 and 20 mmole/m$^2$.

The photoinitiator system, present in the photosensitive layer, comprises one or more compounds which directly furnish free-radicals when activated by actinic radiation. It can also comprise a plurality of compounds, one of which yields free radicals after having caused to do so by another compound, or sensitizer, which has been activated by the radiation.

Numerous conventional photoinitiators systems may be used provided they are compatible with the other ingredients of the element. Useful photoinitiators are ketoxime-esters. Preferred photoinitiator systems are 2,4,5-triphenylimidazolyl dimers in combination with chain transfer agents, or hydrogen donors, such as are disclosed in U.S. Pat. Nos. 3,479,185, 3,784,557, 4,311,783 and 4,622,286. Preferred hexaarylbisimidazoles (HABI) are 2-o-chlorosubstituted hexaphenylbisimidazoles in which the other positions on the phenyl radicals are unsubstituted or substituted with chloro, methyl or methoxy. The most preferred initiator is o-Cl-HABI, i.e., 2,2'-bis-(o-chloro-phenyl)-4,4,5,5',tetraphenyl-1,1'-bisimidazole corresponding to following chemical formula

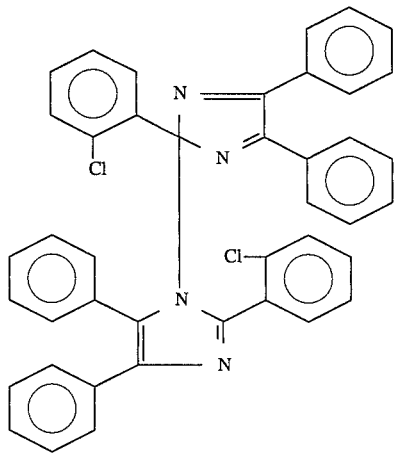

A preferred sensitizer is 7-diethylamino-4-methylcoumarin.

Hydrogen donor compounds useful as chain tranfer agents in the photopolymer layer include: 2-mercaptobenzoxazole, 2-mercaptobenzothiazole, 4-methyl-4H-1,2,4,-triazole-3-thiol, and the like. A preferred hydrogen donor is 2-mercaptobenzoxazole with following formula:

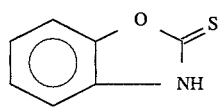

Although the HABI initiating systems described above are preferred, other initiating systems may be used in practicing this invention. Useful photoinitiators described in U.S. Pat. No. 2,760,863 include vicinal ketaldonyl alcohols, such as benzoin, pivaloin, acyloin ethers, e.g. benzoin methyl and ethyl ethers, and α-hydrocarbon-substituted aromatic acyloins, such as α-methylbenzoin.

In order to obtain a neutral black image tone in the higher densities and neutral grey in the lower densities the recording layer contains in admixture with the organic metal salt and/or the reducing agent a so-called toning agent known from thermography or photo-thermography. Preferably this toning agent is incorporated in the photosensitive element but in principle it can also be present in the donor element.

Suitable toning agents are the phthalimides and phthalazinones mentioned in U.S. Pat. No. Res. 30,107. Further reference is made to the toning agents described in U.S. Pat. Nos. 3,074,809, 3,446,648 and 3,844,797. Other particularly useful toning agents are the heterocyclic toner compounds of the benzoxazine dione or naphthoxazine dione type within the scope of following general formula:

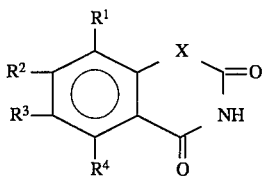

wherein

X represents O or $NR^5$;

each of $R^1$, $R^2$, R3 and $R^4$ (same or different) represents hydrogen, alkyl, e.g. $C_1$–$C_{20}$ alkyl, preferably $C_1$–$C_4$ alkyl, cycloalkyl, e.g. cyclopentyl or cyclohexyl, alkoxy, preferably methoxy or ethoxy, alkylthio with preferably up to 2 carbon atoms, hydroxy, dialkylamino of which the alkyl groups have preferably up to 2 carbon atoms or halogen, preferably chlorine or bromine; or $R^1$ and $R^2$ or $R^2$ and $R^3$ represent the ring members required to complete a fused aromatic ring, preferably a benzene ring, or $R^3$ and $R^4$ represent the ring members required to complete a fused aromatic aromatic or cyclohexane ring. Toners within the scope of said general formula are described in GB-P 1,439,478 and U.S. Pat. No. 3,951,660.

A toner compound particularly suited for use in combination with said polyhydroxy spiro-bis-indane reducing agents is 3,4-dihydro-2,4-dioxo-1,3,2H-benzoxazine described in U.S. Pat. No. 3,951,660.

Examples of useful binders include organic solvent-soluble polymers, e.g. polymers derived from α,β-ethylenically unsaturated compounds such as e.g. polymethyl methacrylate, polyvinyl chloride, a vinylidene chloride-vinyl chloride copolymer, polyvinyl acetate, a vinyl acetate-vinyl chloride copolymer, a vinylidene chloride-acrylonitrile copolymer, a styrene-acrylonitrile copolymer. chlorinated polyethylene, chlorinated polypropylene, a polyester, a polyamide, etc. An especially preferred halogen-free binder, which is ecologically interesting, is polyvinylbutyral containing some vinyl alcohol units (sold under the trade name BUTVAR by MONSANTO Co). Several organic solvents can be used for dissolving and coating these polymers. These polymer binders may be used either alone or in combination of two or more thereof. Also they can be combined with water-soluble binders, e.g. gelatin, polyvinyl alcohol, polyvinyl pyrrolidone, carboxymethyl cellulose, dimethyl cellulose, ethyl cellulose, gum arabic, casein, etc. The above mentioned polymers or mixtures thereof forming the binder may be used in conjunction with waxes or "heat solvents" also called "thermal solvents" or "thermosolvents" improving the reaction speed of the redox-reaction at elevated temperature.

The nature of the binder and the composition of the contiguous layer are chosen as to give rise to the adequate image formation due to changes in the adhesion/cohesion balance.

The contiguous layers 1 and 2 are thin layers with compositions tuned to each other. Preferred combinations of contiguous layer 1 and contiguous layer 2 are following:

combination 1 contiguous layer 1: polyvinylacetate (MOWILITH 30, Hoechst) or co(ethylene-vinylacetate (VINNAPOS EV12, Wacker Chemie); contiguous layer 2: co(methylmethacrylate-butadiene-itaconic acid; 47.5%/47.5%/5%) or co(styrene—butadiene—R—COOH) or co(vinylidenechloride-methacrylic acid-itaconic acid; 88%/10%/ 2%);

combination 2 contiguous layer 1: titanium oxide/polyvinyl alcohol/hydrolized tetramethyl orthosilicate (5.1/1.2/0.5 $g/m^2$); contiguous layer 2: co(vinylidenechloride-methacrylic acid-itaconic acid; 88%/10%/ 2%);

combination 3 contiguous layer 1: CARBOSET 525 (B.F. Goodrich), or MOWILITH DM-6 or DM-22 (Hoechst), or VINAC XX-210 or VINAC 465-DEV (Avi Products) or ELVAX 40W or 150W (Du Pont); contiguous layer 2 (+cover sheet) : MELINEX 054 or 504 or 505 or 582 (subbed PET of ICI), or HOSTAPHAN 4400 or 4500 or 4540 (subbed PET of Hoechst Celanese);

combination 4 contiguous layer 1: natural or synthetic rubber (butadiene or isoprene rubber), or co(styrene-butadiene), or co(styrene-isoprene) or poly(α-olefins); contiguous layer 2: polyethyleneoxide (molecular weight :100,000–600,000) or a combination of polyvinylpyrrolidone and polyethyleneoxide.

The dry coverage of contiguous layers 1 and 2 is preferably comprised between 0.05 and 5 $g/m^2$.

Whether the photopolymerised image parts will adhere after delamination to contiguous layer 1 and the non-polymerised non-image parts will be removed with contiguous layer 2, or vice versa, will depend, when using one of the possible combinations of the contiguous layers described above, on the monomer to binder ratio in the photosensitive layer. It was established experimentally that when this ratio was at least 2.0 the photopolymerised exposed parts after delamination adhered to contiguous layer 1 and the non-polymerised non-exposed parts were removed with contiguous layer 2. Reversal of this polarity of delamination took place when a monomer/binder ratio's lower than 0.5 were established.

The donor element for use in the present invention comprises a support and a donor layer containing a reducing agent and a binder.

Suitable reducing agents for use in the donor element include pyrogallol; 4-azeloyl-bis-pyrogallol; 4-stearyl pyrogallol; galloacetophenone; di-tertiary-butyl pyrogallol; gallic acid anilide; methyl gallate, ethyl gallate; normal- and iso-propyl gallate; butyl gallate; dodecyl gallate; gallic acid; ammonium gallate; ethyl protocatechuate; cetyl protocatechuate; 2,5-dihydroxy benzoic acid, 1-hydroxy-2-naphthoic acid; 2-hydroxy, 3-naphthoic acid; phloroglucinol; catechol; 2,3-naphthalene diol; 4-lauroyl catechol; sodium gallate; protocatechualdehyde; 4-methyl esculetin; 3,4-dihydroxy benzoic acid; 2,3-dihydroxy benzoic acid; hydroquinone; 4,4'-dihydroxy biphenyl; 3,4-dihydroxyphenylacetic acid; 4(3',4'-dihydroxyphenylazo)benzoic acid; 2,2'-methylene bis-3,4,5-trihydroxybenzoic acid; ortho- and para-phenylene diamine; tetramethyl benzidine; 4,4',4"-diethylamino triphenylmethane; o-, m-, and p-aminobenzoic acid; alpha and beta naphthols; 4-methoxy, 1-hydroxy-dihydronaphthalene; and tetrahydroquinoline.

Other useful reducing agents include resorcins, m-aminophenols, alkylphenols, alkoxynaphtols, m-phenylenediamines. A further class of reducing agents is constituted by hydrazine compounds. Especially preferred hydrazine compounds include p-tolylhydrazine hydrochloride, N,N-phenylformylhydrazide, acetohydrazide, benzoylhydrazide, p-toluenesulphonylhydrazide, N,N'-diacetylhydrazine, β-acetyl-phenylhydrazine, etc.

An especially preferred reducing agent is "Spirana", disclosed in European patent application Appl. No. 92203495, and corresponding to following chemical formula:

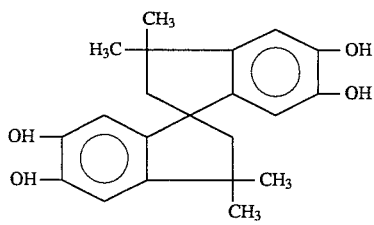

The reducing agents may be used in combination if desired.

Particular organic metal salts of the photosensitive element, especially when they are not organic silver salts, are often preferably used with particular reducing agents in order to optimize the reduction reaction. Examples of such preferred "reaction pairs" can be found e.g. in U.S. Pat. No. 3,722,406, col. 3, table 1.

The chemical nature of the reducing agents dictates the nature of the binder of the donor layer. When water-soluble reducing agents, such as the preferred substances catechol, hydroquinone, ethyl gallate, methyl gallate are used the binder is a hydrophilc polymer such as gelatin, polyvinylalcohol, polyvinylpyrrolidone, hydroxymethylcellulose, hydroxyethylcellulose, methylcellulose, ethylcellulose and polyacrylic acid. Such donor layers can simply be coated from an aqueous solution. When the reducing agent is a water-insoluble compound such as "Spirana" mentioned above the binder will be a hydrophobic film-forming polymer like the ones mentioned for the photosensitive element, e.g. BUTVAR or nitrocellulose; in this case the donor layer must be coated from an organic solvent.

In a most preferred embodiment of the present invention the reducing agent is catechol, preferably in a concentration between 0.5 and 2 g/m$^2$, and the binder of the donor element is simply gelatin.

In the practice of the present invention three different supports are required, being the original support of the photosensitive element, the covering sheet bearing contiguous layer 2 to which the element will be laminated, and finally the support of the donor element. These supports may be opaque or transparent, e.g. a paper support or resin support. When a paper support is used preference is given to one coated at one or both sides with an Alpha-olefin polymer, e.g. a polyethylene layer which optionally contains an anti-halation dye or pigment. Useful transparent organic resin supports include e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. In a most preferred embodiment the supports are simply all three polyethylene terephthalate supports (PET 1,2 and 3).

The photosensitive element for use in the present invention can be exposed before or after the first lamination step of the process described. In the latter case it is clear that at least one of the original support of the photosensitive element or of the cover sheet must be transparent to actininic radiation in order to allow proper exposure. The element can be image-wise exposed by any convenient source the radiation to which it is sensitive. As stated above the spectral sensitivity can be regulated by the addition of spectral sensitizers, particularly useful in the case of laser exposure. In the most simple embodiment the element is contact-exposed using a UV-light source.

The two lamination steps of the present invention are preferably performed by a laminator comprising two rollers such as a CODOR LAMIPACKER LPP 650 (marketed by Dormed B. V., Amsterdam) heated preferably between 50° C. and 130° C. The elements to be laminated are preferably conveyed through the laminator at a speed between 20 and 150 cm/min.

The delamination steps occurring in the practice of the present invention can be performed manually or mechanically.

In an alternative embodiment of the present invention the position of the organic metal salt and the reducing agent are interchanged, in other words the organic metal salt is present in the donor element while the reducing agent is present in the photosensitive element. It will be clear that a similar result will be obtained. In this case the reduced metal image will be formed in the donor by the action of reducing agent diffusing in, so that the donor element becomes properly speaking an acceptor element.

The present invention will be illustrated by the following example without however being limited thereto.

EXAMPLE preparation of the photosensitive element:
On a transparent polyethylene terephthalate support (PET 1) were coated following layers:
contiguous layer 1: to 219 g of an aqueous solution containing 5% of polyvinylalcohol were added subsequently, whilst stirring, 46 g of hydrolized 22% tetramethyl orthosilicate emulsion in water, 50 g of a dispersion containing 40% of a Polyethylene latex (average particle size 0.15 µm and molecular weight 18000 g/mol) and 15 g of a 5% aqueous solution of a wetting agent. To this mixture was added 640 ml water and the pH was adjusted to pH=6. This dispersion was coated at 30° C. on a polyester support (containing a hydrophilic adhesion layer) to a dry coating thickness of 3 µm after drying at room temperature;
photosensitive layer: a coating solution containing following ingredients was prepared:

a dispersion containing 5.25 g of silver behenate powder, 1.75 g of polyvinylbutyral (BUTVAR B79, Monsanto), 18.0 g of methylethylketone, a 48.5% solution of reactive monomer II-7 (table 2) in methylethylketone, 0.69 g of photoinitiator o-Cl-HABI, i.e., 2,2'-bis-(o-chlorophenyl)-4,4,5,5', tetraphenyl-1,1'-bisimidazole (see chemical formula in the Detailed Description section), 0.4 g of hydrogen donor 2-mercaptobenzoxazole, 0.052 g of Michler's ketone.

This coating solution was applied at room temperature on top of contiguous layer 1 by means of a BRAIVE coating knife giving rise to a wet coating tickness of 50 μm. Then the layer was dried for about 12 hours at room temperature using ventilation. The dry layer then contained following ingredients per m²:

6.4 g of silver behenate, 2.13 g of polyvinylbutyral, 9.1 g of monomer II-7, 0.84 g of bisimidazole, 0.05 g of mercaptobenzoxazole, 0.06 g of Michler's ketone.

This photosensitive element was laminated in a CODOR LAMIPACKER LPP650 onto the subbing layer, constituting contiguous layer 2, of a second polyethylene terephtalate covering sheet (PET 2). This subbing layer contained Co(vinylidene chloride—methylacrylate—itaconic acid; 88%/10%/2%). The lamination was performed at 110° C. using a conveying speed of 45 cm per minute.

The resulting layer pack was exposed at the side of PET 2 through a test pattern original on a PRINTON CDL1501 contact exposure unit marketed by Agfa-Gevaert N.V. Then the support and the cover sheet were separated by peeling-off whereby the exposed photopolymerised image parts adhered to contiguous layer 1 and the original support PET 1, and the non-exposed image parts adhered to contiguous layer 2 and the cover sheet PET 2.

preparation of the donor element

A coating solution was prepared containing 0.6 g of catechol, 2.0 g of gelatin (type KOEPF 10239) and 30.7 g of demineralised water. This coating solution, warmed up to 40° C., was applied by means of a BRAIVE coating knife giving rise to a wet thickness of 100 μm on a PET support (PET 3) subbed with a layer identical to contiguous layer 2, at a temperature of the coating plate of 15° C. After coating the layer was dried at room temperature using ventilation for about 12 hours. The dry layer then contained 1.26 g/m² of catechol and 4.2 g/m² of gelatin.

image formation

The donor element was laminated by means of the laminator described above onto that delaminated part of the photosensitive element which contained the non-photopolymerised parts. This lamination was performed at a temperature of 110° C. with a conveying speed of 30 cm/min. On those regions where the silver behenate was present metallic silver was formed by the thermal diffusion of catechol followed by reduction. After delamination a positive image of the test pattern original was obtained showing faithful line and screen dot rendering and good physical quality. Minimum and maximum densities were measured with a Macbeth densitometer TD904; a maximum density of 1.74 and a minimum density of 0.02 above the support density were obtained.

A similar lamination/delamination procedure was performed using that delaminated part of the photosensitive element containing the polymerised image parts. An excellent negative image of the original was obtained.

We claim:

1. Process for forming an image comprising following steps:

(1) providing a photosensitive element comprising:
      (a) a support,
      (b) a contiguous layer 1, contiguous to said support,
      (c) a photosensitive layer or layer pack comprising, divided over one or more layers, a polymeric binder, an organic metal salt, a photoinitiator, and a polymerisable monomer, (2) laminating a cover sheet bearing a contiguous layer 2, contiguous to said cover sheet, onto said photosensitive element, so that said contiguous layer 2 faces said photosensitive layer or layer pack, said support or said cover sheet being transparent to actinic radiation, (3) exposing information-wise by actinic radiation said photosensitive element before or after performing said lamination step (2), thereby inducing photopolymerisation of said polymerisable monomer, (4) peeling apart said support, and said cover sheet whereby either the exposed or the unexposed regions of said photosensitive layer adhere to said contiguous layer 1, and whereby the other regions adhere to contiguous layer 2, thus forming an imaged element A and an imaged element B, (5) providing a donor element comprising a support ($S_D$) and a donor layer containing a binder and a reducing agent, capable of becoming diffusable under the influence of heat, (6) bringing in contact said donor element with its donor layer side onto one of said elements A or B, thereby transferring reducing agent to said element A or B, and inducing reduction of the organic metal salt thus forming a metal image, and finally peeling apart said donor element from said metal image.

2. Process according to claim 1 wherein said photosensitive element comprises a double layer pack, comprising an undermost layer containing said organic metal salt and an uppermost layer containing said monomer and said photoinitiator.

3. Process for forming an image comprising following steps:

(1) providing a photosensitive element comprising:
      (a) a support,
      (b) a contiguous layer 1, contiguous to said support,
      (c) a photosensitive layer or layer pack comprising, divided over one or more layer a polymeric binder, a reducing agent capable of becoming diffusable under the influence of heat, a photoinitiator and a polymerisable monomer, (2) laminating a cover sheet bearing a contiguous layer 2, contiguous to said cover sheet, onto said photosensitive element, so that said contiguous layer 2 faces said photosensitive layer, said support or said cover sheet being transparent to actinic radiation, (3) exposing information-wise by actinic radiation said photosensitive element before or after performing said lamination step (2), thereby inducing photopolymerisation of said polymerisable monomer, (4) peeling apart said support and said cover sheet whereby either the exposed or the unexposed regions of said photosensitive layer adhere to said contiguous layer 1, and whereby the other regions adhere to contiguous layer 2, thus forming an imaged element A' and an imaged element B', (5) providing a donor element comprising a support ($S_D$) and a donor layer containing a binder and a reducible organic metal salt, (6) bringing together said donor element with its donor layer side onto one of elements A' or B', thereby transferring reducing agent to the donor element and inducing reduction of the organic metal salt contained in said donor element thus forming a metal image, and finally peeling apart said donor element from said element A' or B'.

4. Process according to claim 3 wherein said photosensitive element comprises a double layer pack, comprising an undermost layer containing said reducing agent and an uppermost layer containing said monomer and said photoinitiator.

5. Process according to claim 1 or 3 wherein said photosensitive element comprises one single photosensitive layer.

6. Process according to claim 1 or 3 wherein said organic metal salt is an organic silver salt.

7. Process according to claim 6 wherein said organic silver salt is silver behenate.

8. Process according to claim 1 or 2 wherein said reducing agent is catechol.

9. Process according to claim 1 or 2 wherein said reducing agent is following compound:

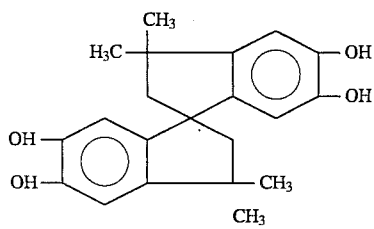

10. Process according to claim 1 or 2 wherein said photosensitive layer or layer pack of said photosensitive element further contains an optical sensitizer.

11. Process according to claim 1 or 2 wherein said photosensitive element and/or said donor further contains a toning agent.

12. Process according to claim 1 or 2 wherein said photopolymerisable monomer is chosen from the group consisting of pentaerythritol tetraacrylate, pentaerythritol triacrylate, trimethylolpropane triacrylate and dipentaerythritol pentacrylate.

13. Process according to claim 1 or 2 wherein said photopolymerisable monomer is a reactive monomer represented by general formula (I) or (II):

$$A[-NHCO-X-L^1(-(L^2)_u-OCO-CR^1=CH_2)_n]_m \quad (I)$$

wherein n represents an integer from 1 to 3, m equals an integer of 3 to 6 when n equals 1, and 2 to 6 when n equals 2 or 3, and u equals 0 or 1;

A represents an organic group of the following nature being 3 to 6 valent when n equals 1 and being 2 to 6 valent when n equals 2 or 3:

a) a hydrocarbon residue containing 5 to 25 carbon atoms which may be interrupted by one or more ether, ester or amide functions;

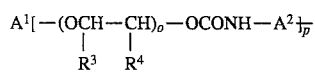

with $A^1$ representing a linear or branched aliphatic residue that may contain 0 to 3 O-atoms and 2 to 20 C-atoms, an aromatic residue containing 6 to 24 carbon atoms, an aromatic aliphatic residue containing 7 to 28 C-atoms or an cycloaliphatic residue containing 6 to 26 C-atoms, $R^3$ and $R^4$ each independently representing a hydrogen or a methyl group, $A^2$ representing a hydrocarbon residue containing 5 to 25 carbon atoms, o represents an integer of 0 to 5 and p represents an integer of 2 to 6 when n equals 2 or 3 and represents an integer of 3 to 6 when n equals 1;

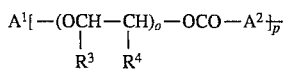

wherein $A^1$, $A^2$, $R^3$, $R^4$, o and p have the same meaning as defined above

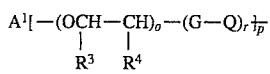

wherein $A^1$, $A^2$, $R^3$, $R^4$, o and p have the same meaning as defined above G represents $-O-CO-NH-Y(-COO-)_q-$;
  wherein Y represents a divalent (cyclo)aliphatic residue containing 2 to 15 C-atoms and that may contain an ester, ether or urethane function, and q represents 0 or 1

Q represents a linear or branched aliphatic hydrocarbon residue containing 3 to 15 carbon atoms and which may comprise 1 to 3 oxygen bridges and r equals 0 or 1, X represents O or $NR^2$, $L^1$ represents an aliphatic hydro carbon residue that is at least divalent and that may comprise 1 to 3 O-atoms, $L^2$ represents a lower alkylene of 1 to 6 C-atoms which may be branched or linear, $R^1$ represents hydrogen or a methyl group, $R^2$ represents hydrogen or a lower alkyl group of 1 to 6 C-atoms;

$$Ur[-R^7-NHCO-Z-R^8(-OCO-\underset{R^9}{C}=CH_2)_\alpha]_\beta \quad (II)$$

wherein
wherein

Ur represents a divalent or trivalent condensed urea residue;

Z represents O or $NR^{10}$ with $R^{10}$ representing alkyl containing 1 to 12 C-atoms;

$R^7$ represents a divalent hydrocarbon residue containing 2 to 25 C-atoms;

$R^8$ represents a hydrocarbon residue with a valence between 2 and 6, and containing 2 to 18 C-atoms, which can be linear or branched and which can be interrupted by upto 3 O atoms;

$R^9$ represents hydrogen or methyl;

α represents an integer from 1 to 5, and

β equals 2 or 3.

14. Process according to claim 13 wherein said monomer represented by general formula (I) comprises one of the following residues as hydrocarbon residue A and/or $A^2$:

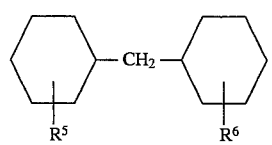

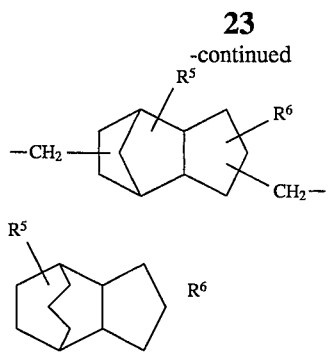

wherein $R^5$ and $R^6$ each independently represents hydrogen or a lower alkyl of 1 to 6 C-atoms, s and t independently represent an integer from 1 to 6 and wherein the aliphatic hydrocarbon residues Ia, Ic and Id comprise 2 to 6 free valences.

15. Process according to claim 13 wherein the condensed urea residue represented by Ur in monomer general formula (II) is chosen from the structural units:

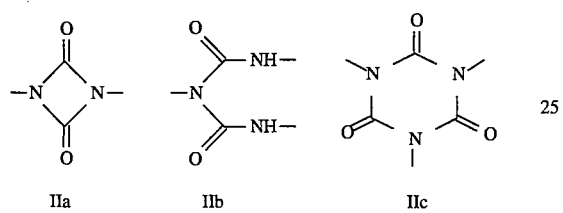

16. Process according to claim 15 wherein said monomer corresponds to following formula:

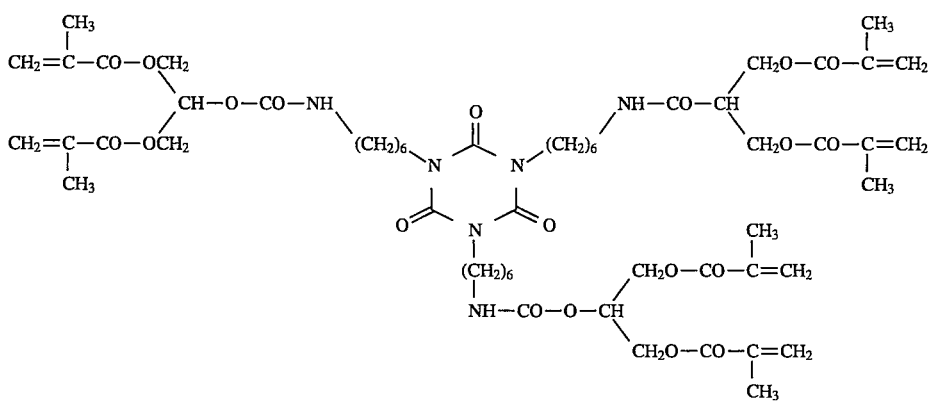

* * * * *